United States Patent [19]
Larson et al.

[11] Patent Number: 6,109,530
[45] Date of Patent: Aug. 29, 2000

[54] INTEGRATED CIRCUIT CARRIER PACKAGE WITH BATTERY COIN CELL

[75] Inventors: Erik N. Larson, San Diego; Brant Candelore, Escondido, both of Calif.

[73] Assignees: Motorola, Inc., Schaumburg, Ill.; General Instrument Corporation, Horsham, Pa.

[21] Appl. No.: 09/111,806

[22] Filed: Jul. 8, 1998

[51] Int. Cl.[7] .................................................. G06K 19/06
[52] U.S. Cl. ......................... 235/492; 361/728; 257/691
[58] Field of Search ........................... 235/492, 487–489, 235/437–438, 441, 380, 382; 257/678–679, 666, 691, 684, 688, 700; 361/679, 737, 728, 785–786, 820, 772–774, 807–810, 813; 340/825.54, 825.49

[56] References Cited

U.S. PATENT DOCUMENTS

| | | |
|---|---|---|
| 3,662,230 | 5/1972 | Redwantz . |
| 3,736,741 | 6/1973 | Paratte . |
| 4,251,604 | 2/1981 | Umemoto . |
| 4,264,917 | 4/1981 | Ugon . |
| 4,371,595 | 2/1983 | Suwa . |
| 4,487,820 | 12/1984 | Engelstein et al. . |
| 4,521,828 | 6/1985 | Fanning . |
| 4,774,633 | 9/1988 | Dehaine et al. . |
| 4,820,658 | 4/1989 | Gilder, Jr. . |
| 4,822,988 | 4/1989 | Gloton . |
| 4,864,383 | 9/1989 | Gloton et al. . |
| 4,908,502 | 3/1990 | Jackson . |
| 4,990,759 | 2/1991 | Gloton et al. . |
| 5,008,776 | 4/1991 | Queyssac . |
| 5,119,269 | 6/1992 | Nakayama . |
| 5,147,982 | 9/1992 | Steffen . |
| 5,214,566 | 5/1993 | Dupre et al. . |
| 5,283,712 | 2/1994 | Michihira et al. . |
| 5,508,231 | 4/1996 | Ball et al. . |
| 5,557,504 | 9/1996 | Siegel et al. . |
| 5,583,373 | 12/1996 | Ball et al. . |
| 5,914,671 | 6/1999 | Tuttle . |
| 6,016,255 | 1/2000 | Bolan et al. . |

OTHER PUBLICATIONS

Websters New World Dictionary 1988.
"50 Ways to Touch Memory," 2nd edition, Dallas Semiconductor, Oct., 1992, pp. 1–3.

*Primary Examiner*—K. P. Hantis
*Attorney, Agent, or Firm*—Barry R. Lipsitz; Ralph F. Hoppin; Douglas M. McAllister

[57] ABSTRACT

A chip-battery micro-module and fabrication method thereof wherein an integrated circuit "chip" is secured to a battery coin cell using various conductive and insulative layers that provide power to the chip while also forming a protective structure for protecting the chip. The chip-battery micro-module may be used to power an electronic accessory which is directly attached thereto, such as an LCD display or speaker, or to power a circuit in a smart card or electronic device such as a portable telephone. The chip may be secured to the battery using epoxy layers, epoxy bodies, dielectric layers, and plasma- or vapor-deposited layers. The above elements may be conductive or insulative as required. The chip-battery micro-module can be integrated into a plastic smart card. The use of the rigid battery coin cell provides the chip-battery micro-module with improved strength characteristics for withstanding loads and impacts during assembly and handling. Moreover, this protection can be extended to other components that are packaged with the chip as an assembly, such as electronic accessories. Furthermore, electromagnetic shielding and heat sink properties may be realized.

52 Claims, 9 Drawing Sheets

INTEGRATED CIRCUIT CARRIER PACKAGE WITH BATTERY COIN CELL

BACKGROUND OF THE INVENTION

The present invention relates to a compact carrier package and fabrication method thereof that uses a battery coin cell for carrying an integrated circuit (IC), e.g., "chip".

Currently, there is an ongoing trend toward miniaturization of circuitry and packaging to hold the circuitry. Packaging with a portable power source is a natural progression of the technology. For example, it is desirable to package a chip with a battery for "smart cards" and other security products, cardboard or plastic packaging used to create low cost active displays, portable calculators, watches, toys, and numerous other electronic devices that use so-called "coin cell" or "button" batteries.

A coin cell battery generally refers to a battery with a wafer-shaped housing with conductive leads for powering a chip. The housing is usually plated with nickel or other metal.

An IC may be provided in a micro-module, which is plug-in, miniature circuit composed of micro-elements such as resistors, capacitors, and/or transistors. In a smart card implementation, for example, the micro-module is carried within a cavity of a plastic card body. Conventional contact micro-module technology for smart cards has flush mounted contacts on a chip carrier package. The package is required to get power from a host, and is delivered typically as 5 volts on a contact of the package. Such contacts may be referred to as "ISO contacts" when conforming to standards of the International Standards Organization.

Conventional radio-frequency (RF) micro-module technology has an antenna in the body of a smart card or RF ID package to couple power into the chip package. The chip is able to bi-directionally communicate through the antenna as well.

Batteries have been used in connection with the RF micro-modules to reduce or eliminate the required electro-magnetic field strength needed make them operate. Calculators, including buttons, a keypad, an LCD, and a piezo-electric speaker have also been mounted in smart cards with internal batteries. In all of these uses, the batteries have typically been lithium foil or flat cell technology. The batteries are fabricated into either plastic card cavities, or sandwiched into multi-layer boards. The chip or circuitry is typically connected through traces or wires with either a solder or spot weld connection made to the battery itself.

However, several problems arise with the conventional battery-chip packaging technology. For example, lithium foil or flat cell batteries have problems at elevated temperatures, e.g., in an automobile on a hot day, a set-top television/data converter box (e.g., decoder), or a television set. In fact, the battery can fail after only a few weeks of exposure to extreme temperatures. Coin cells, on the other hand, have superior mechanical properties allowing for better behavior at extended high temperatures.

Accordingly, it would be desirable to find a way to use temperature-resistant coin cells in tight form factor devices such as smart cards, and to make easier and more reliable connections to the chip carrier package and other devices.

Additionally, due to the constant drive for miniaturization of electronic devices, it would be desirable to have a compact chip carrier and battery package.

It would further be desirable to have a flexible structure for housing a chip with a relatively large die size, e.g., greater than 25 mm$^2$.

Moreover, it would be desirable to have a structure for securing a chip that takes advantage of the lower cost and greater availability of coin cells relative to lithium foils or flat cells.

It would further be desirable to have a structure that does not experience "plastic creep" as a failure mode. Conventional holders for batteries can experience plastic creep, thereby potentially causing the battery connection to fail over long time periods.

The structure should also be easy and inexpensive to manufacture, and should protect the chip from dust, moisture, and impacts.

The present invention provides a carrier package for a chip, and a corresponding method, having the above and other advantages.

SUMMARY OF THE INVENTION

The present invention relates to a compact carrier package and fabrication method thereof that uses a battery coin cell for carrying an integrated circuit (IC).

The chip carrier system uses a coin cell as a substrate. A film is mounted on the coin cell, and the chip is mounted on the film. Alternatively, vapor and plasma deposition can be used to eliminate the flex that may be present in the film. The chip can be placed directly on deposited layers on the coin cell. Various mounting techniques allow ISO contacts, and electronic accessories, such as buttons, keypads, LCDs, microphones, or piezo-electric speakers to be mounted on either side of the battery. The carrier system can be immobilized, thereby allowing the use of larger chip sizes without concern for damaging bending forces. The entire assembly can be used as is or made more rugged with a plastic coating, smart card body, or other holder. The invention thus allows the use of relatively inexpensive nickel plated coin cells to house a chip to provide a compact, rigid structure.

The integrated circuit chip package of the present invention includes a battery having a metal support surface, and anode and cathode contacts. For example, with a coin cell battery, the top and/or bottom surfaces can be support surfaces. Furthermore, the top surface may be a cathode contact, while the bottom surface is an anode contact, or vice-versa. Means are provided for securing an integrated circuit chip proximate to, e.g., near, the support surface. Circuitry is provided for electrically coupling the anode and cathode contacts to the chip.

The support surface of the battery is substantially planar.

The securing means may include a deposited insulation layer on the support surface; a deposited conductive layer altitudinally away from (e.g., above) the support surface after the deposited insulation layer; and means for electrically coupling the deposited conductive layer to one of the anode and cathode contacts. The chip may be secured to the deposited conductive layer altitudinally away from (e.g., above) the support surface after the plasma-deposited conductive layer. An epoxy body may encapsulate the chip to protect it.

Alternatively, the securing means for the chip may include a conductive layer on the support surface, where the conductive layer is electrically coupled to one of the anode and cathode contacts. This conductive layer may include conductive epoxy. Epoxy provides good adhesive properties and may be doped to provide a desired conductivity.

A first bond wire extends from the chip to electrically couple the chip to the conductive layer and one of the anode and cathode contacts, while a second bond wire extends from the chip to the other of the anode and cathode contacts.

A dielectric layer that substantially surrounds the chip may be disposed altitudinally away from the support surface after the conductive layer. A bottom foil layer may be disposed between the conductive layer and the dielectric layer. A top foil portion, including at least first and second electrically separated portions thereof, may be disposed altitudinally away from the support surface after or before (e.g., above or below) the dielectric layer. The dielectric layer protects the chip, and provides support for an additional electronic accessory or contact to be placed on top of the chip.

The first and second top foil portions may be respective foil layers that extend over at least a portion of an area of the support surface. Alternatively, instead of being planar layers, the first and second top foil portions may only be conductive traces on the dielectric layer.

The chip may be secured to the first and second top foil portions altitudinally away from the support surface after, or before, the first and second top foil portions. Furthermore, an epoxy body may encapsulate the chip, at least in part.

At least one conductive passage known as a "via" may extend in the dielectric layer for electrically coupling the first top foil portion to one of the anode and cathode contacts. In this case, means are provided for electrically coupling the second top foil portion to the other of the anode and cathode contacts, such as a flexible flap that extends from the second top foil portion, and past the dielectric layer toward the other of the anode and cathode contacts. Furthermore, a ring may surround the battery for securing the flexible flap to it.

The flexible flap or other protruding structure may be provided on the battery-chip micro-module to align the battery with a corresponding recess in a cavity in which the battery is received. This prevents rotation of the battery-chip micro-module in the cavity and aligns the contact properly with any surrounding, external circuitry.

An electronic accessory, such as a keypad, speaker, LCD display or the like, may be carried by the first and/or second top foil portions.

While the above embodiments provide the chip and surrounding structure on one support surface of the battery, such as the top surface, it is possible to provide further structure on the opposing, bottom surface of the battery to secure another chip or electronic accessory thereto. For example, a second conductive layer may be provided on the opposing surface, where the second conductive layer is electrically coupled to one of the anode and cathode contacts, followed by a second dielectric layer and a second top foil layer, where the second top foil layer is adapted to carry an electronic accessory thereon. A second bottom foil layer may be disposed between the second conductive layer and the second dielectric layer.

In any embodiment of the chip-battery micro-module, a first contact, such as an ISO contact, may be used to allow the battery to provide power to an external electronic device, i.e., other than the chip carried on the battery. The first contact may be located after the structure used for securing the chip to the battery. Means are provided for electrically coupling the first contact to one of the anode and cathode contacts. The bottom of the battery may act as the other of the anode and cathode contacts. For example, the top foil portions may be patterned according to the ISO contact to electrically couple the contact to the chip.

The ISO contact may be orientation-less, e.g., having a number of concentric circles that electrically contact a corresponding pattern on the top foil layer. The orientation-less feature allows the contact to be provided on the top foil layer in any orientation, thereby saving assembly time and eliminating the potential for misalignment.

In a specific application, a smart card is provided for housing the battery-chip micro-module. The smart card has its own electrical circuit that is powered by the battery-chip micro-module by coupling the first contact and the other of the anode and cathode contacts to the electrical circuit. The smart card may also have circuitry that communicates with the chip of the battery-chip micro-module. For example, the chip and smart card circuitry may provide control signals to one another.

A corresponding method for fabricating a chip-battery micro-module is also presented.

BRIEF DESCRIPTION OF THE DRAWINGS

FIG. 1b is a profile view of FIG. 1a.

FIG. 4b is a profile view of FIG. 4a.

DETAILED DESCRIPTION OF THE INVENTION

The present invention relates to a compact carrier package and fabrication method thereof that uses a battery coin cell for carrying an integrated circuit (IC).

In the figures, like-numbered elements correspond to one another.

Figure 1A:
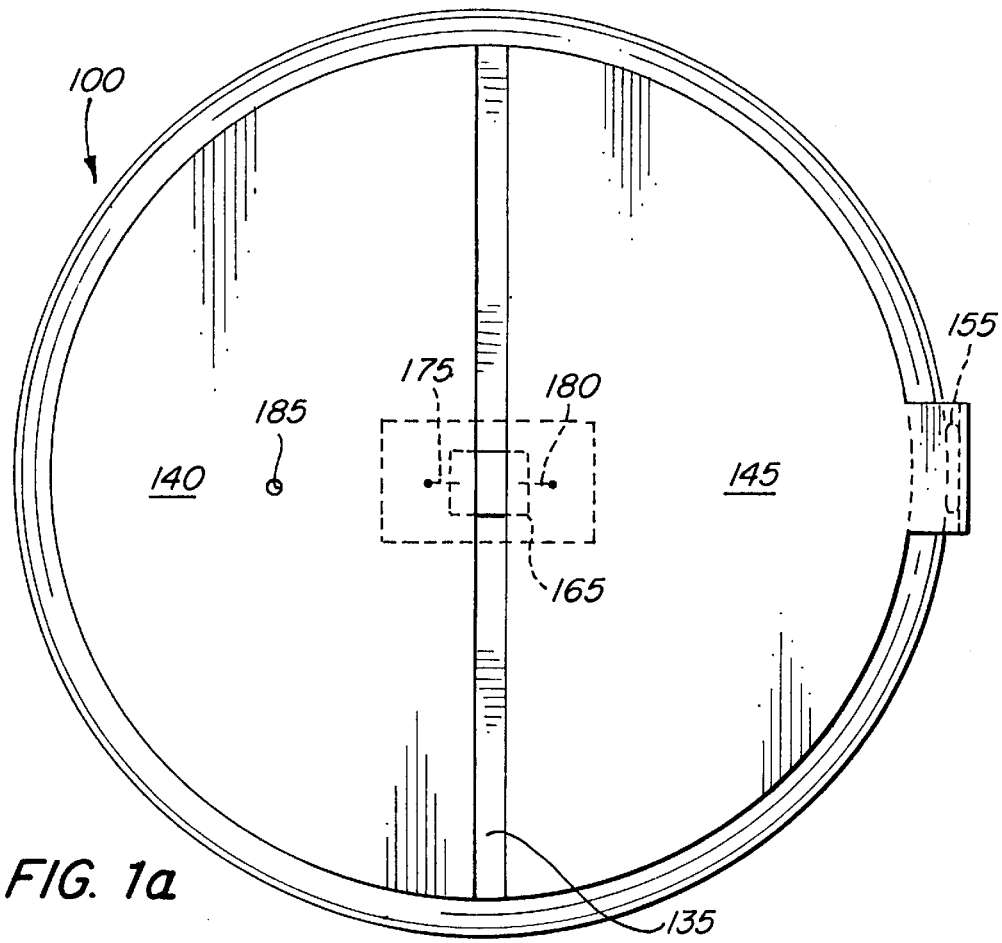
FIG. 1a illustrates a top view of a chip-battery micro-module in accordance with the present invention.
Figure 1B:
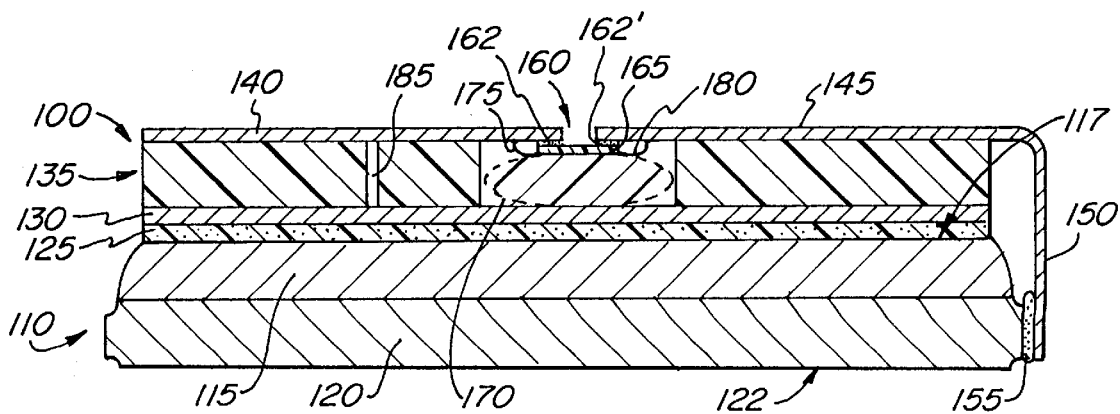

FIG. 1a illustrates a top view of a chip-battery micro-module in accordance with the present invention. FIG. 1b is a profile view of FIG. 1a.

The chip-battery micro-module, shown generally at 100, includes a conventional coin cell battery 110, which comprises a top portion 115 and a bottom portion 120. In each of the figures herein, the top portion 115 may be a cathode contact, while the bottom portion 120 is an anode contact, or vice-versa. The top portion 115 and bottom portion 120 are therefore electrically insulated from one another. Moreover, the top and bottom battery portions are generally made of metal, such as steel, and have planar surfaces plated with nickel or other suitable material.

The top surface 117 of the battery 110, which is the surface of the top portion 115, is considered to be a "support surface" in the embodiment shown since the chip 165 and surrounding structure is generally carried, supported by, and secured to, the top surface 117. The bottom surface 122 of the bottom portion 120 of the battery 110 is considered to be an "opposing surface" since it opposes the surface 117. The bottom surface 122 can be a support surface, such as in the embodiment of FIG. 5.

A layer 125, such as a conductive epoxy layer, is applied to a portion, or substantially all of, the top surface 117. A bottom foil layer 130, such as copper or gold foil or other conductive element, is attached to the conductive epoxy layer 125. The epoxy layer 125 provides good adhesion properties for adhering the bottom foil layer 130 to the top surface 117. A dielectric layer 135 is attached to the bottom foil layer 130. Generally, the dielectric layer 135 may be provided on part of, or substantially all of, the top surface 117 depending on the area of the bottom foil layer 125. The dielectric layer 135 preferably surrounds the chip 165 fully, or at least in part.

An altitudinal reference scheme may be defined relative to the top surface 117, where altitude extends upwardly away from the top surface 117. Thus, the bottom foil layer 130 is altitudinally after the conductive epoxy layer 125, and the dielectric layer 135 is altitudinally after the bottom foil layer 130, and so forth.

A top foil layer is provided on the dielectric layer 135, and includes a first top foil portion 140 and a second top foil portion 145, which are electrically separated by a gap 160. The top foil may also comprise copper or gold foil or other conductive element, with a thickness of 2–3 thousands of an inch, for example, or greater as required for structural rigidity. The second top foil portion 145 optionally includes a flexible circuit flap 150 which extends toward the bottom portion 120 of the battery. Specifically, the second top foil portion 145 is electrically coupled to an anode contact at the bottom portion 120 using a conductive epoxy body 155 or other suitable adhesive or solder to connect the flexible flap 150 to a circumferential side of the bottom portion 120.

For improved reliability, additional redundant flaps similar to the flexible circuit flap 150 may be provided. Or, the flexible circuit flap 150 may extend about a perimeter of the battery 110.

The flexible flap 150, or other protruding or notch-like structure may be provided on the battery-chip micro-module to align the micro-module with a corresponding recess or tab in a cavity in which the battery is received.

The chip 165 may be attached to the underside of the first and second top foil portions 140 and 145, respectively, using die attach adhesive 162 and 162'.

The bottom foil layer 130, dielectric layer 135, and top foil portions 140, 145 may be a pre-fabricated circuit board type structure into which the chip 165 is installed. The pre-fabricated structure can then be attached as a unit to the top surface 117 using the conductive epoxy layer 125.

A via 185 extends from the first top foil portion 140 to the bottom foil 130 to provide a conductive path therebetween. A via generally is a metal plated through-connection of layers of a substrate. Since the bottom foil portion 130 and the conductive epoxy layer 125 are electrically coupled to the cathode contact of the top surface 117, the via 185 and the first top foil portion 140 are also coupled to the cathode.

As best seen in FIG. 1a, the dielectric layer 135 includes a void or cut-out region in which the chip 165 is provided. This void may be left empty, or may be filled with a protective material 170 such as epoxy, also know as "glob top", for example. The protective material 170 serves to protect the chip from dust, moisture and impact. The chip 165 may be partially or fully encapsulated in the material 170. The material 170 may also be adhered to the top foil layer portion 140 and 145.

To electrically couple the cathode and anode contacts of the battery 100 to the chip 165, a first bond wire 175, and second bond wire 180, are provided. The first bond wire 175 electrically couples the chip 165 to the first top foil portion 140, and consequently to the top surface 117 of the battery 110 through via 185, foil 130 and conductive epoxy layer 125. The second bond wire 180 electrically couples the chip 165 to the second top foil portion 145, and consequently to the bottom portion 120 of the battery via conductive epoxy or solder 155. Bond wire is a thin wire used generally to electrically couple input/output pads and package pads of a die (e.g., chip). Of course, other electrically conductive members may be used to electrically couple the chip with the first 140 and second 145 top foil portions.

Moreover, more than two electrical connections may be required by the chip 165, in which case additional bond wires or other conductive members may be used, along with modifications to the chip securing structure as required, such as additional vias or flexible flap connections. For example, it is possible to space the flexible flaps circumferentially from one another to provide several conductive paths to the bottom portion 120 of the battery. Additionally, the vias may be spaced radially and/or circumferentially from one another in the dielectric layer 135.

The protective material 170 may serve to protect the bond wires 175 and 180 as well as the chip 165. As seen in FIG. 1a, the first 140 and second 145 top foil portions and the dielectric layer 135 cover substantially all of the top surface 117 of the battery 100, with the exception of the cut out region for the chip 165 and protective material 170. However, it will be appreciated that many variations on this configuration are possible.

Figure 15:
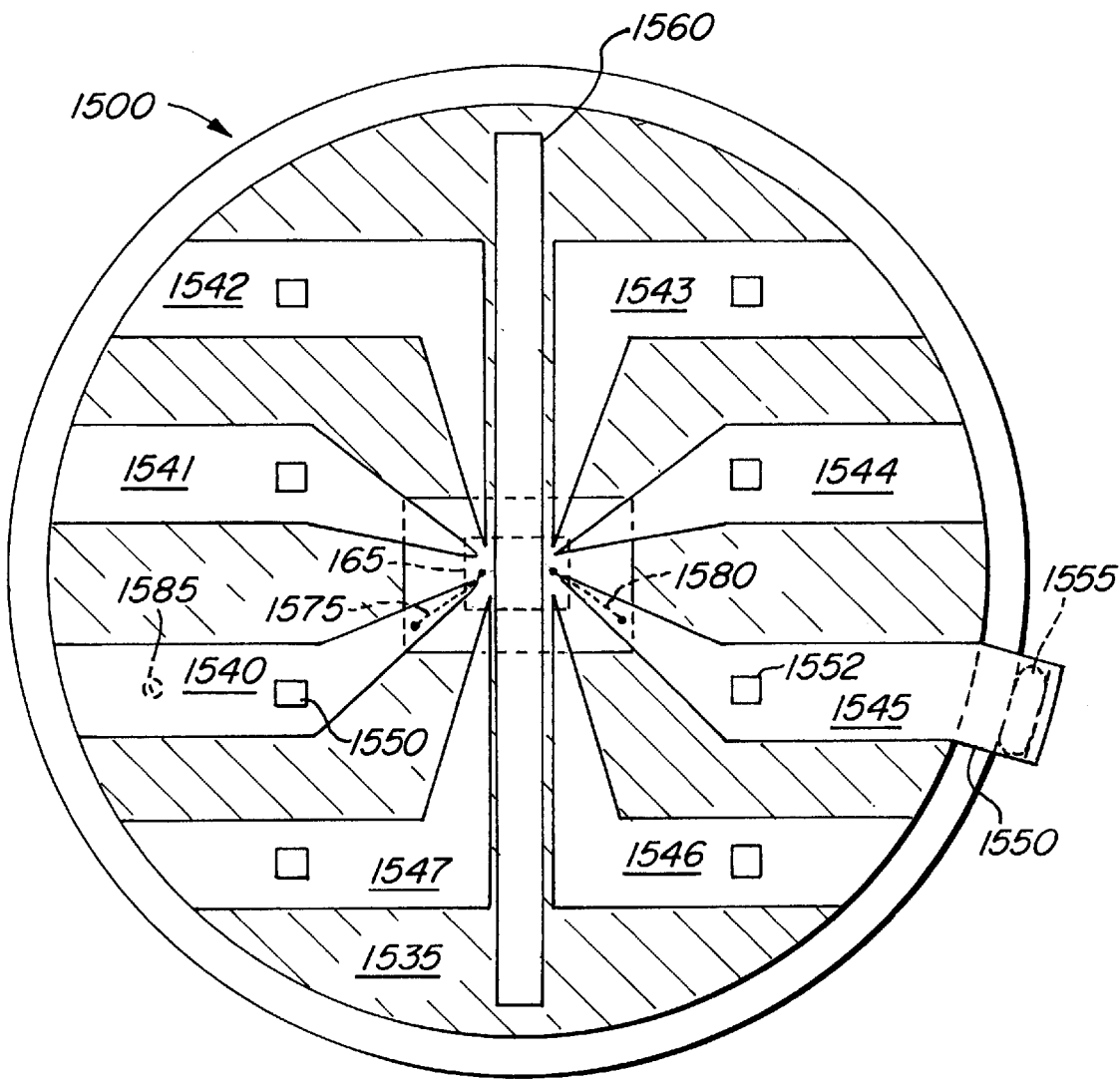
FIG. 15 illustrates a top foil layout for the chip-battery micro-module of FIGS. 1a and 1b in accordance with the present invention.

For example, the dielectric layer 135 may cover only a portion of top surface 117. Additionally, the first 140 and second 145 top foil portions need not be planar layers, but may be thin conductive traces. Furthermore, the first top foil portion 140 need only extend between the via 185 and the first bond wire 175. Additionally, the top foil portions may be provided in a specific pattern as shown in FIG. 15, for example.

Moreover, it may be desirable to provide a support underneath the first 140 and second 145 top foil portions near the gap 160 by filling the region with an additional dielectric portion as part of the dielectric layer 135, or with some other nonconductive body.

Currently, the overall die size of the chip 165 has been limited to 25 mm$^2$ or less for smart card applications and the like, while the surface area of the coin cell battery 110 may be approximately ten times greater. In accordance with the present invention, the battery may accommodate larger sized chips, or several chips on a single battery. The thickness of the structure of FIGS. 1a and 1b may be only a few millimeters.

In accordance with the present invention, the battery 110 forms a rigid structure that supports and protects the chip 165. For example, the battery 100 protects the chip from bending loads and other forces that may be experienced during assembly and handling of the chip, or while in an electronic device in which the chip is inserted. Moreover, the battery 110 may provide electromagnetic shielding of the chip 165 due to the metal coin cell construction, as well as due to the internal battery structure. The battery 110 may further act as a heat sink for the chip and surrounding circuitry.

Figure 2:
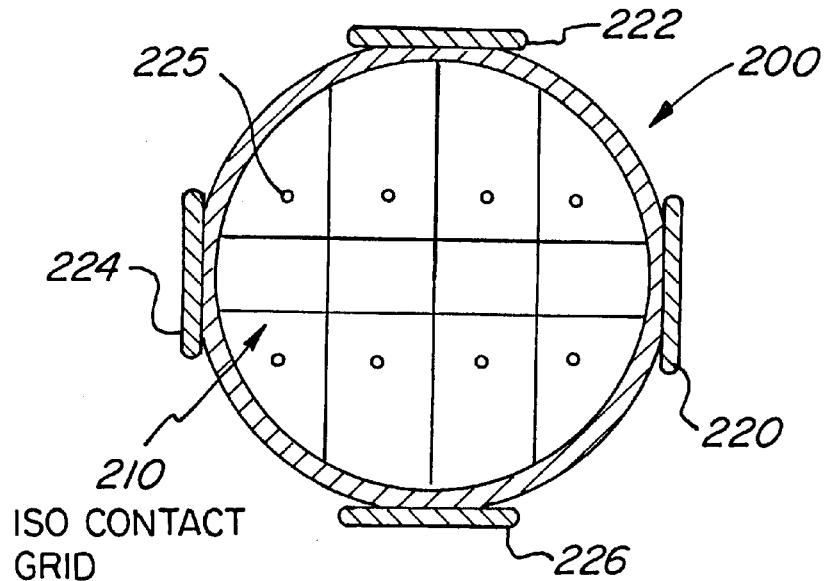
FIG. 2 illustrates a top view of a chip-battery micro-module with oriented ISO contacts in accordance with the present invention.

FIG. 2 illustrates a top view of a chip-battery micro-module with oriented ISO contacts in accordance with the present invention. ISO contacts have a structure corresponding to the International Standards Organization layout. The structure shown illustrates how an electrical contact can be provided on top of the structure which has been built up on the battery to house the chip, for example, as illustrated in FIGS. 1a and 1b, to electrically connect the battery to an additional electrical accessory.

The contact structure 200 includes a grid of ISO contacts 210. A number of contact points, such as contact point 225, are provided. A total of eight contact points are shown, although fewer or more may be provided. Additionally, flexible flaps 220, 222, 224 and 226 are provided around the circumference of the contact structure 200 to secure the structure 200 to the chip-battery micro-module, e.g., by wrapping the flaps around the periphery of the chip-battery micro-module. The flaps 220, 222, 224 and 226 may be semi-rigid metal or wire tabs, for example.

When the contact structure is placed adjacent to the top foil portions of the chip-battery micro-module 100, the ISO contacts 210 touch corresponding locations on the top foil to provide an electrical connection therebetween. For example, two of the ISO contacts may touch corresponding locations on the first 140 and second 145 top foil portion, respectively. This may be understood more fully by referring to FIG. 15 and associated discussion, below.

Accordingly, the contact structure 200 allows the battery 110 to provide current to an additional electrical accessory other than the chip 165.

Figure 3:
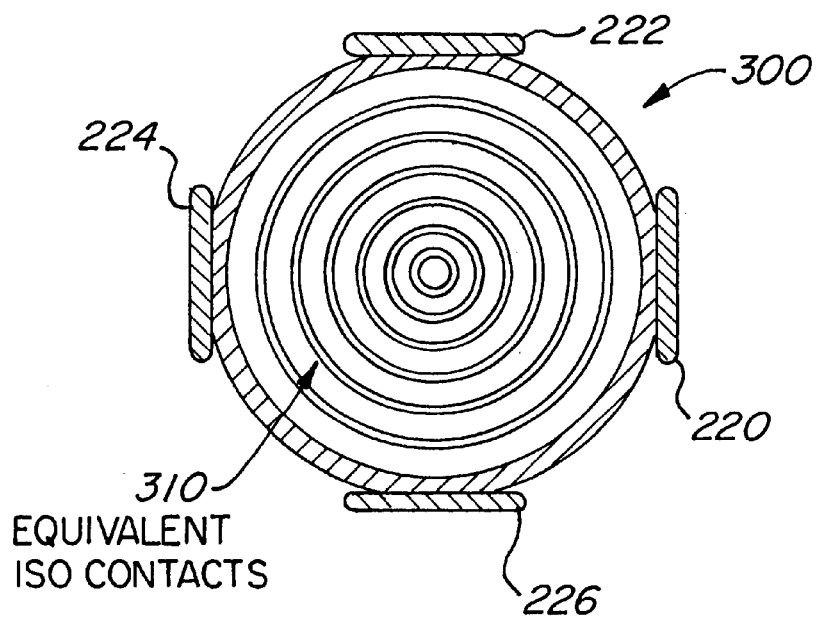
FIG. 3 illustrates a top view of a chip-battery micro-module with an orientation-less ISO contact in accordance with the present invention.

FIG. 3 illustrates a top view of a chip-battery micro-module with an orientation-less ISO contact in accordance with the present invention. The contact structure 300 is analogous to the contact structure 200 of FIG. 2. However, here an orientation-less contact 310 that is equivalent to the ISO contact 210 of FIG. 2 is used. The equivalent ISO contacts 310 include a series of concentric conductive rings which are electrically coupled to corresponding top foil portions of the chip-battery micro-module 100.

For example, first and second ones of the conductive rings may contact the first 140 and second 145 top foil portions, respectively.

The contact structure 300 allows the battery 110 to provide current to an additional electrical accessory, e.g., other than the chip 165.

Figure 4A:
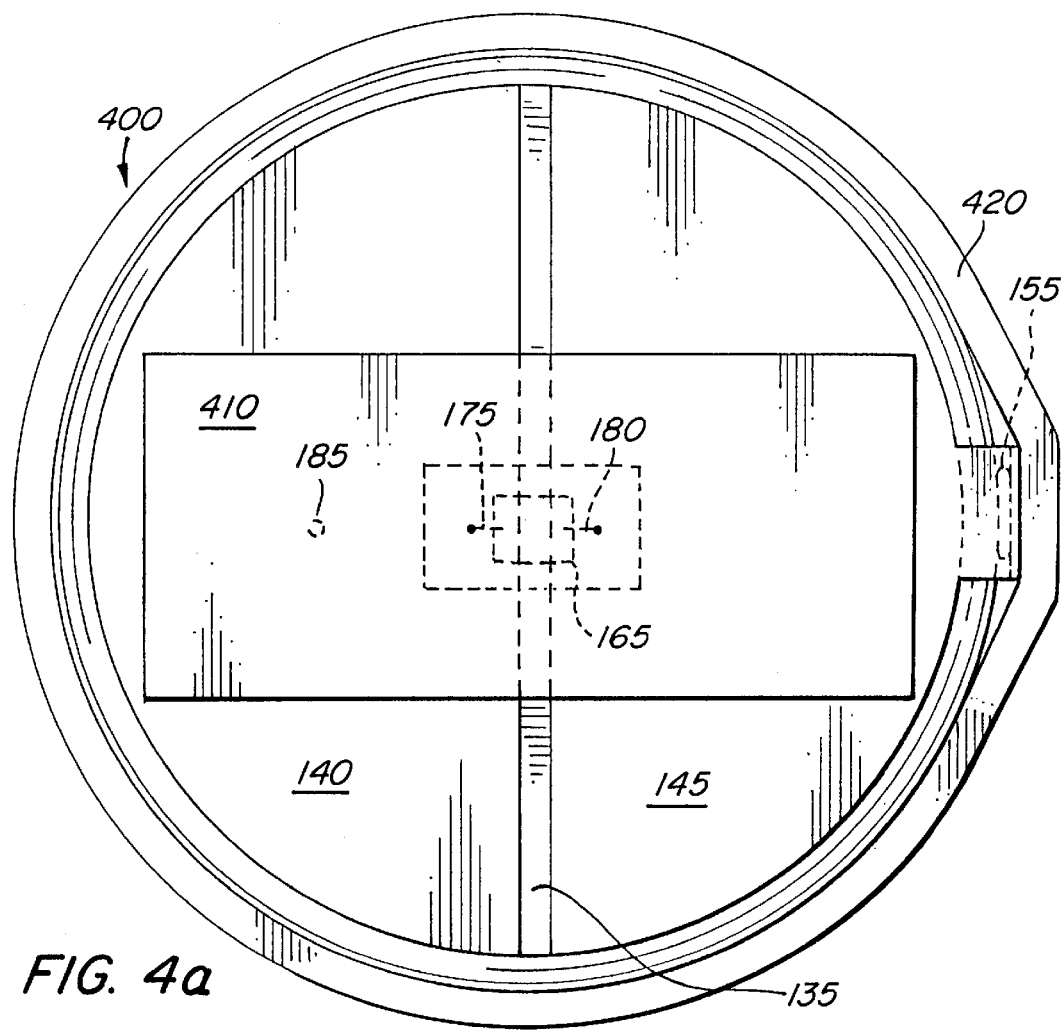
FIG. 4a illustrates a top view of a chip-battery micro-module with a top-mounted electronic accessory in accordance with the present invention.
Figure 4B:
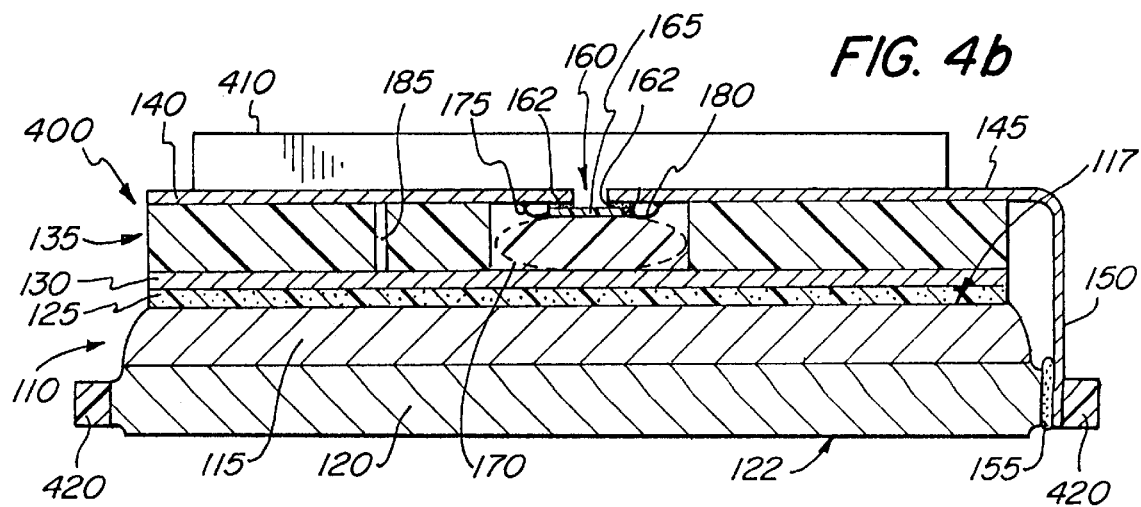

FIG. 4a illustrates a top view of a chip-battery micro-module with a top-mounted electronic accessory in accordance with the present invention. FIG. 4b is a profile view of FIG. 4a.

Here, an annular ring 420 is shrink wrapped around the battery 110 to hold the flexible flap 150 in place. Furthermore, an electronic accessory 410 is provided on the first 140 and second 145 top foil layers. The electronic accessory 410 may be a Liquid Crystal Display (LCD), microphone, piezo-electric speaker, button, or keypad, or portion thereof, for example. The electronic accessory 410 may be electrically coupled to the first 140 and/or second 145 top foil portions using a contact as described in FIGS. 2 and 3 or using other known techniques.

Cardboard or plastic packaging, for example, may be used with the electronic accessory 410 and chip-battery micro-module 400 to create low cost active displays, portable calculators, watches, toys, and numerous other known electronic devices that use coin cell batteries.

Figure 5:
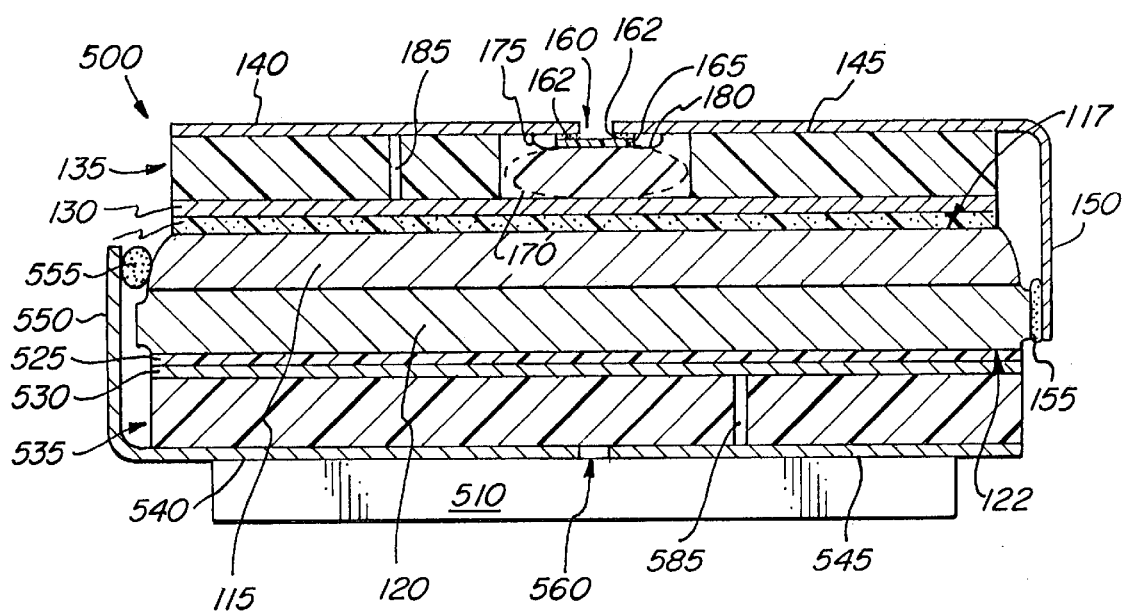
FIG. 5 illustrates a profile view of a chip-battery micro-module with a bottom-mounted electronic accessory in accordance with the present invention.

FIG. 5 illustrates a profile view of a chip-battery micro-module with a bottom-mounted electronic accessory in accordance with the present invention. The chip-battery micro-module 500 includes structure for securing the chip 165 to the top surface 117 of the battery as discussed in connection with FIGS. 1a and 1b. Here, an analogous structure is provided on the bottom surface 122 of the battery 110.

Specifically, a second conductive layer 525, such as conductive epoxy, is applied to a portion of, or substantially all of, the bottom surface 122. A second bottom foil layer 530 is attached to the second conductive epoxy layer 525. A second dielectric layer 535 is provided after the second bottom foil layer 530, and first 540 and second 545 top foil layer portions are provided after the dielectric layer. A gap 560 insulates the first 540 and second 545 top foil layer portions from one another. A via 585 electrically couples the second top foil portion 545 to the conductive layer 525 and bottom portion 120 of the battery.

Furthermore, a flexible circuit flap 550 electrically connects the first top foil portion 540 to the top portion 115 of the battery 110 via a conductive epoxy body 555.

An altitudinal reference scheme may be defined for the bottom surface 122, where altitude extends downwardly away from the bottom surface 122. Thus, the second bottom foil layer 530 is altitudinally after the second conductive epoxy layer 525, and the second dielectric layer 535 is altitudinally after the second bottom foil layer 530, and so forth.

An electronic accessory 510, analogous to the electronic accessory 410 of FIGS. 4a and 4b, is attached to the first 540 and second 545 top foil portions of the battery's bottom portion 120. The electronic accessory 510 may be electrically coupled to the first 540 and second 545 top foil portions in a manner apparent to those skilled in the art. The contact structures of FIGS. 2 and 3 may also be used.

Furthermore, two contact structures, such as disclosed in FIGS. 2 and 3, may be used with the chip-battery micro-module 500, e.g., one on the top and one on the bottom.

Figure 6:
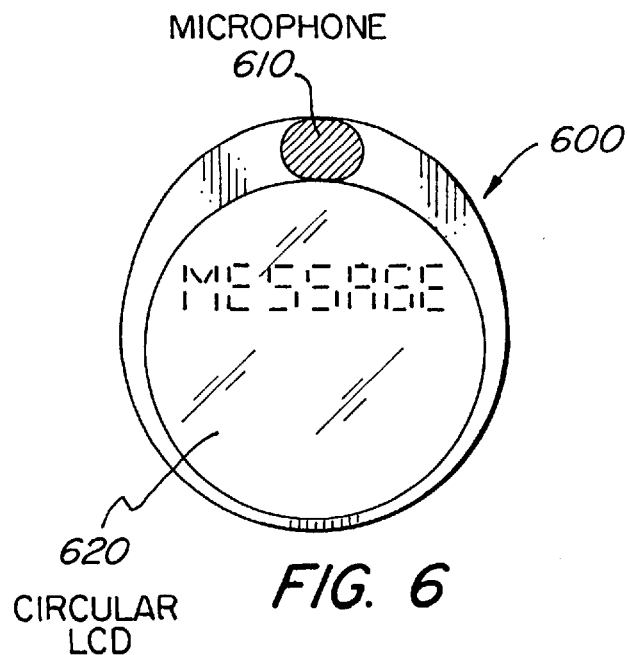
FIG. 6 illustrates a top view of a chip-battery micro-module with an LCD and microphone in accordance with the present invention.

FIG. 6 illustrates a top view of a chip-battery micro-module with an LCD and microphone in accordance with the present invention. A combined electronic accessory 600 includes an LCD display 620, that displays an alphanumeric or other message (e.g., "MESSAGE"), and a microphone 610. The electrical accessory 600 is exemplary of the type of electrical accessory referred to as elements 410 and 510 of FIGS. 4a and 4b, and 5, respectively.

For example, the top view of the chip-battery micro-module 400 of FIG. 4a could provide the view as seen in FIG. 6, assuming a circular electrical accessory was used.

Figure 7:
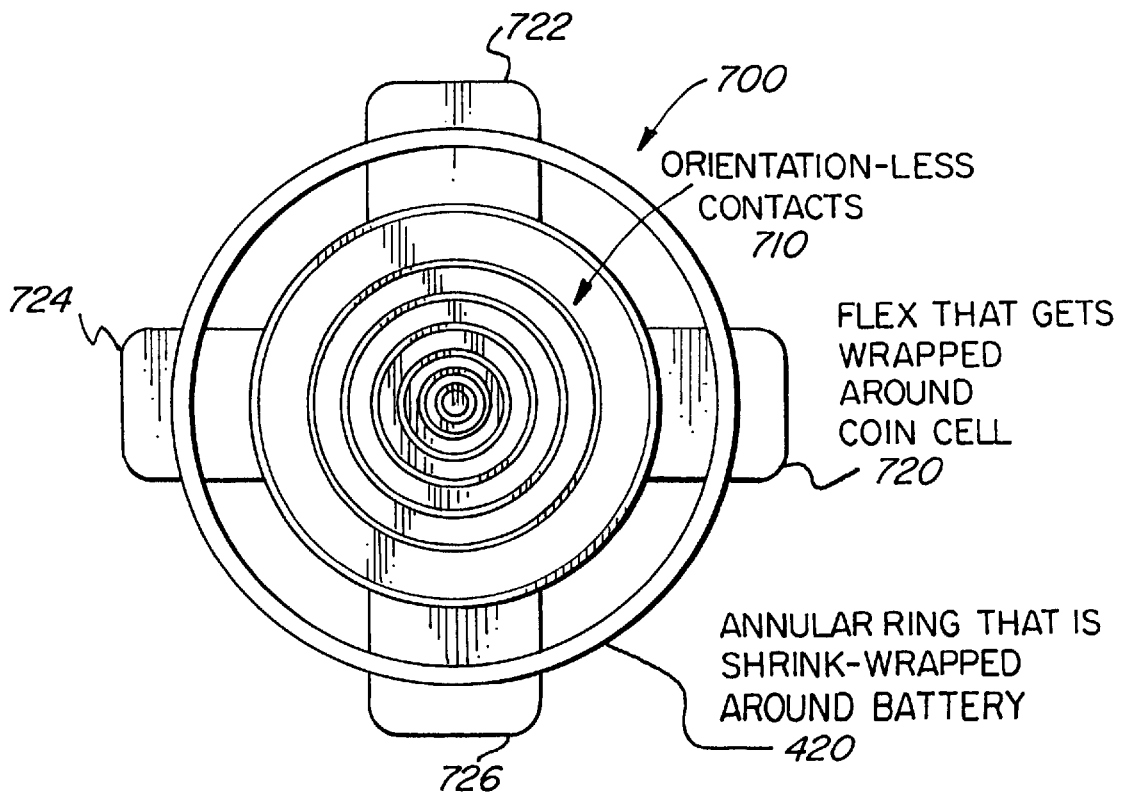
FIG. 7 illustrates a contact structure for a chip-battery micro-module with flexible flaps for contacting the battery in accordance with the present invention.

FIG. 7 illustrates a contact structure of a chip-battery micro-module with flexible flaps for contacting the battery in accordance with the present invention. The contact structure 700 is analogous to the contact structure 300 of FIG. 3.

An orientation-less contact 710 includes a series of concentric conductive rings which are electrically coupled to only one of the first 140 and second 145 top foil portions of the chip-battery micro-module 100, or to the corresponding top foil portion 540, 545 of the bottom of the battery, as in the embodiment of FIG. 5.

The contact structure 700 includes flex constructs 720, 722, 724 and 726 that can be wrapped around the battery coin cell to secure the contact structure 700 thereto. An annular ring 420, shown also in FIGS. 4a and 4b, may be shrink-wrapped around the battery to secure the flex constructs to the battery, thereby also securing the contact structure 700 to the chip-battery micro-module. The flex constructs 720, 722, 724 and 726 may be semi-rigid metal or wire tabs, for example.

Figure 8:
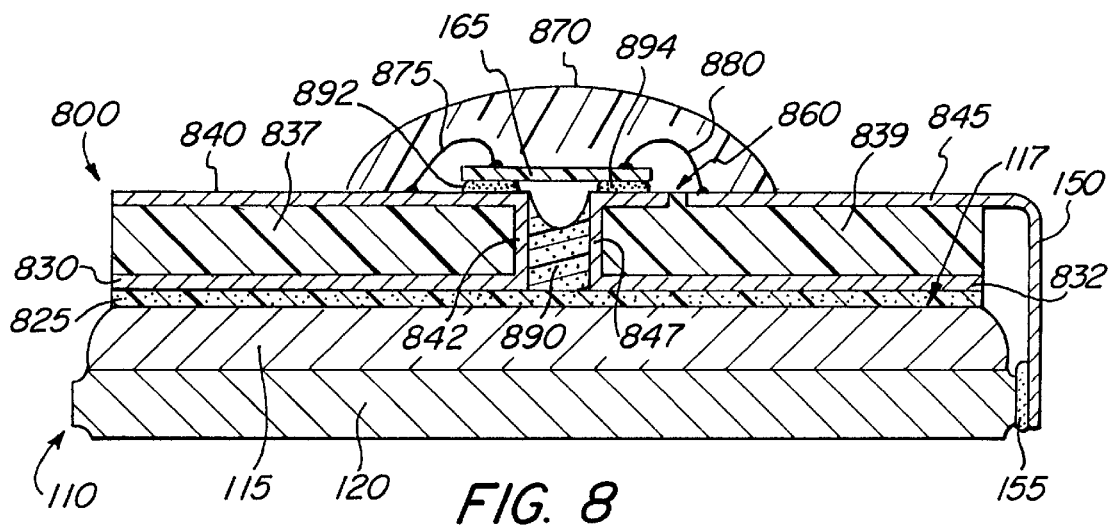
FIG. 8 illustrates a profile view of a chip-battery micro-module with the chip encapsulated in epoxy in accordance with the present invention.

FIG. 8 illustrates a profile view of a chip-battery micro-module with the chip encapsulated in epoxy in accordance with the present invention. A conductive layer 825, such as epoxy, is attached to the top surface 117 of the battery 110. A bottom foil layer, including portions 830 and 832, is attached altitudinally after the conductive layer 825. A dielectric layer, such as polyimide, is provided in a first portion 837 and a second portion 839. A first portion of a top foil layer includes a horizontal portion 840 and a vertical portion 842. Similarly, a second portion of the top foil layer includes a horizontal portion 845 and a vertical portion 847. A gap 860 in the horizontal portion 845 provides an electrical separation therein. The vertical portions 842, 847 define a plated hole from the horizontal portions 840, 845 to the bottom foil layer portions 830 and 832.

Additional vertical portions of the top foil layer may be provided, or the vertical portions may be provided as a single circumferential vertical portion, as will be apparent from the description of FIG. 9, below.

The die, or chip, 165, is attached to the horizontal portions 840, 845 of the top foil using a die attach epoxy 892, 894, having a low temperature cure, which need not be conductive. A conductive epoxy 890 is provided between the vertical foil portions 842, 847. Generally, a void may be present above the conductive epoxy 890 since a conservative amount of epoxy should be used to prevent overflow.

Bond wires 875 and 880 electrically couple the chip 165 to the first and second horizontal foil portions 840 and 845, respectively. The bond wire 880 is attached to the second horizontal foil portion 845 after the gap 860 to electrically connect with the bottom portion of the battery 120 via the conductive epoxy 155 and flap 150. The first horizontal foil portion 840 is electrically connected to the top portion 115 of the battery via the vertical foil portions 842 and 847, the conductive epoxy 890, the bottom foil 830, and the conductive epoxy 825.

An epoxy body 870 encapsulates and protects the chip 165 and bond wires 875, 880 from damage due to dust, moisture, impacts from assembly and handling, and so forth.

The bottom foil layer portions 830, 832, dielectric layer portions 837, 839, horizontal top foil portions 840, 845 and vertical foil portions 842, 847 may be provided in a pre-fabricated circuit board type structure into which the chip 165 is installed. The pre-fabricated structure can then be attached as a unit to the top surface 117 using the conductive epoxy layer 825.

Figure 9:
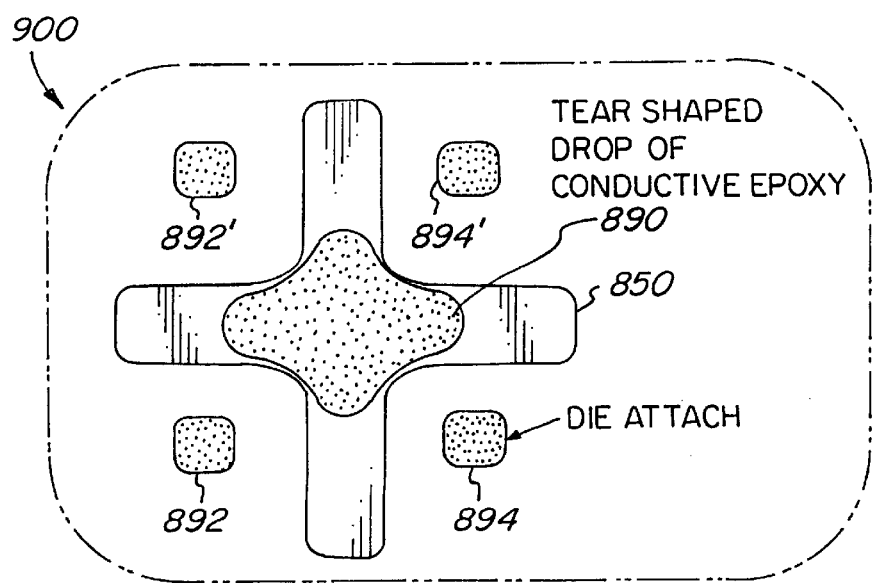
FIG. 9 illustrates a top view of a cut-out pattern for the chip-battery micro-module of FIG. 8 in accordance with the present invention.

FIG. 9 illustrates a top view of a cut-out pattern for the chip-battery micro-module of FIG. 8 in accordance with the present invention. The pattern 900 illustrates a channel 850 that is formed by the polyimide layer 837, 839. While the channel 850 is shown extending in two directions, it may alternatively extend in one direction, or may be formed as a generally circular, square or otherwise symmetric region according to the structure of the polyimide layer 837, 839.

A tear shaped drop of conductive epoxy 890 is flowed into the channel 850. Additionally, die attach epoxy 892, 892', 894, and 894' is provided for attaching the die to the top foil portions 840, 845.

Figure 10:
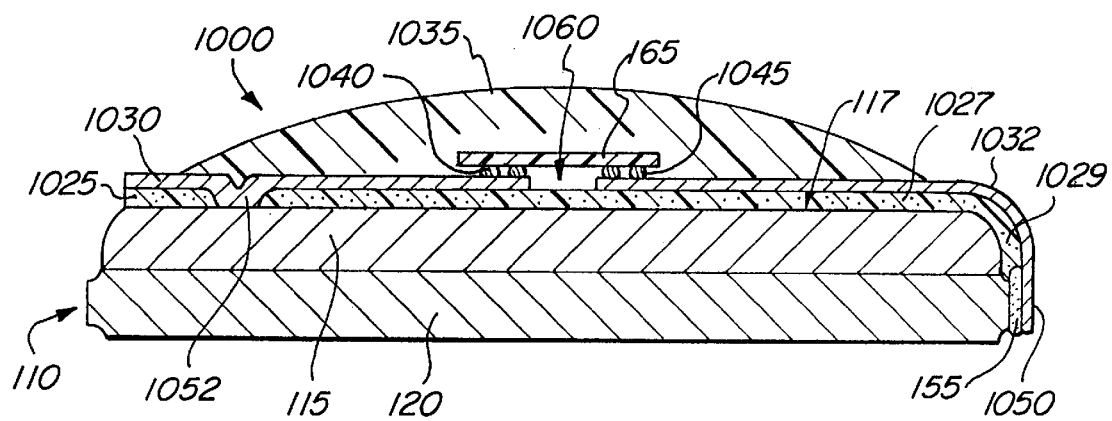
FIG. 10 illustrates a profile view of a chip-battery micro-module with a deposited substrate and the chip mounted using a controlled collapse chip connection (C4) in accordance with the present invention.

FIG. 10 illustrates a profile view of a chip-battery micro-module 1000 with a deposited substrate and the chip mounted using a controlled collapse chip connection (C4) in accordance with the present invention. The chip 165 may be a flip-chip, which refers to a type of chip that can be used with C4 to connect pads on the surface of the chip to a substrate using solder balls. With this technology, the use of bond wires to the chip can be avoided.

An insulation layer 1025, 1027, which may be vapor-deposited, for example, is provided on the top surface 117 of the battery 110. The layer may be provided in portions 1025 and 1027 that are separated by a gap 1052 using known masking techniques. An insulation layer portion 1029 may extend around a corner of the top portion 115 of the battery 110 to the conductive epoxy body 155.

A conductive trace or layer 1030, 1032, which may be plasma-deposited, for example, is provided over the insulation layer 1025, 1027. The layer 1030, 1032 may be applied in two electrically insulated portions 1030 and 1032 that are separated by a gap 1060. A portion of the conductive trace 1030 enters the gap 1052 to contact the top surface 117 of the battery to form an electrical connection therebetween. A flexible flap 1050 connects the conductive trace portion 1032 to the bottom portion 120 of the battery 110 via the conductive epoxy body 155.

The chip 165 has conductive pads, e.g., on its underside, that are soldered using solder balls 1040 and 1045 to the conductive trace portions 1030 and 1032, respectively, to provide electrical connections to the chip.

An epoxy glob top body 1035 is used to encapsulate the chip 165 and surrounding area of the conductive trace portions 1030 and 1032.

Figure 11:
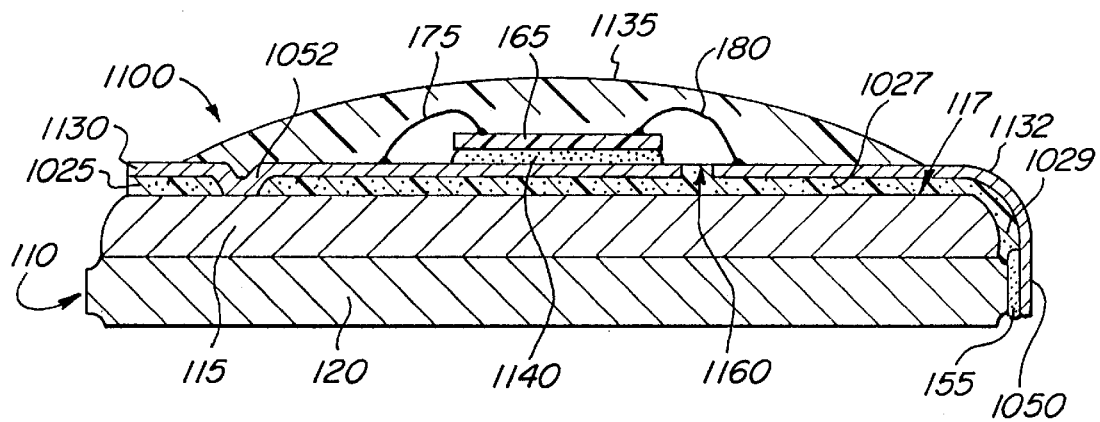
FIG. 11 illustrates a profile view of a chip-battery micro-module with a deposited substrate and a deposited conductive trace in accordance with the present invention.

FIG. 11 illustrates a profile view of a chip-battery micro-module 1100 with a deposited substrate and a deposited conductive trace in accordance with the present invention.

A conductive trace or layer 1130, 1132, which may be plasma deposited, for example, is applied to the insulation layer 1025, 1027, which may be vapor-deposited, for example. The layer 1130, 1132 may be applied in two portions 1030 and 1032 that are separated by a gap 1160 using known masking techniques.

The chip 165 is attached to the conductive trace portion 1130 using a non-conductive epoxy layer 1140. The chip 165 is then electrically coupled to the first and second conductive trace portions or layers 1130 and 1132 via bond wires 175 and 180, respectively.

An epoxy glob top body 1135 is used to encapsulate the chip 165, bond wires 175 and 180, and surrounding area of the conductive trace portions or layers 1130 and 1132.

Figure 12:
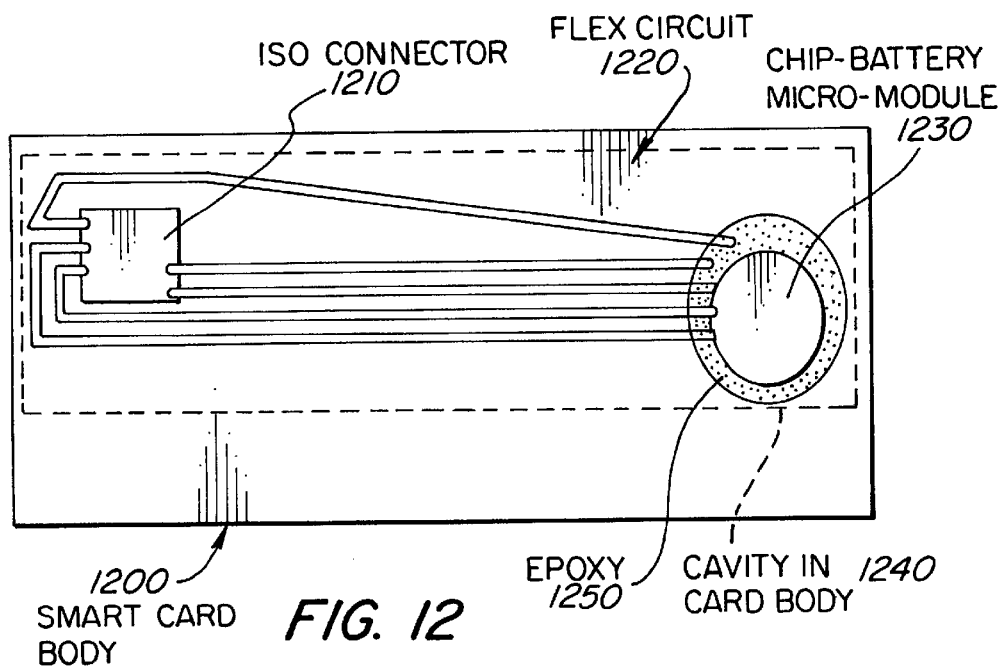
FIG. 12 illustrates a top view of a chip-battery micro-module attached to a thinner ISO compliant contact area such as a smart card in accordance with the present invention.

FIG. 12 illustrates a top view of a chip-battery micro-module attached to a thinner ISO compliant contact area such as a smart card in accordance with the present invention. Smart cards are typically flexible plastic credit-card sized cards that are highly portable. The card may be inserted into a card reader to identify a person, provide information such as health records, gain access to a building, or make a transaction, for example.

The card may be used with a reader in a television set-top box to purchase television, audio or other programming services delivered to the set-top box via a cable television network or satellite broadcast network, or goods offered for sale, e.g., on a home shopping channel, for example. The card and the chip-battery micro-module may have circuitry for transmitting information via an upstream path to a headend controller for making such transactions, may have a pre-stored credit which is decremented for each transaction, or may store transaction information for downloading when the card is subsequently returned to a processing center, e.g., by mail.

The chip-battery micro-module 1230 of the present invention may be used in the smart card body 1200 to provide electric power to circuitry in the card, and/or to provide a processor in the chip for controlling the circuitry in the card. Alternatively, the chip-battery micro-module 1230 may simply be housed in the smart card body 1200 for convenience and protection.

Here, the chip-battery micro-module 1230 is housed in a cavity 1240 in the card body 1200, e.g., using epoxy 1250. The chip-battery micro-module 1230 provides electric power to a flex circuit 1220 and to an ISO connector 1210, which may be used for interfacing with a card reader, for example.

It is also possible for the battery-chip micro-module to interface directly with, and provide power to, a card reader. This avoids the need to provide the card reader with its own power source.

Moreover, the chip of the chip-battery micro-module 1230 may communicate with an external circuit, such as the flex circuit 1220, by sending and/or receiving control signals.

Generally, the chip-battery micro-module 1230 can be built to have a height which is no greater than the thickness of the smart card, e.g., about 3 mm.

Figure 13:
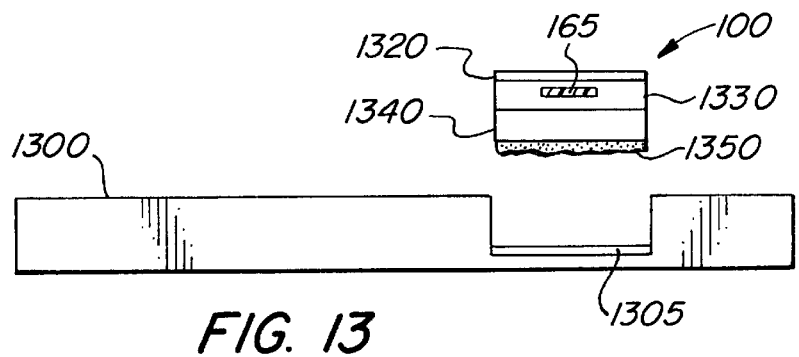
FIG. 13 illustrates a profile view of a smart card using the chip-battery micro-module of FIGS. 1a and 1b in accordance with the present invention.

FIG. 13 illustrates a profile view of a smart card using the chip-battery micro-module of FIGS. 1a and 1b in accordance with the present invention. The chip-battery micro-module 100 includes an ISO contact 1320, such as discussed with FIGS. 2, 3 or 7, a structural layer 1330 in which the chip 165 is secured, the coin cell battery 1340, and a conductive epoxy layer or globule 1350. The smart card 1300 includes a contact 1305 which is electrically coupled to the bottom surface of the battery 1340 via the conductive epoxy layer or globule 1350. Circuitry in the card 1300 may therefore be powered via the contacts 1320 and 1305.

Alternatively, instead of using the conductive epoxy layer or globule 1350 to secure the chip-battery micro-module 100 in the smart card 1300, a mechanical connection may be used so that the chip-battery micro-module 100 can be easily replaced in the event of failure of the chip 165 or the battery 1340 without damaging the smart card 1300. Such a mechanical connection may include a press fit, locking tab, or various other fastening structures which will be apparent to those skilled in the art.

Figure 14:
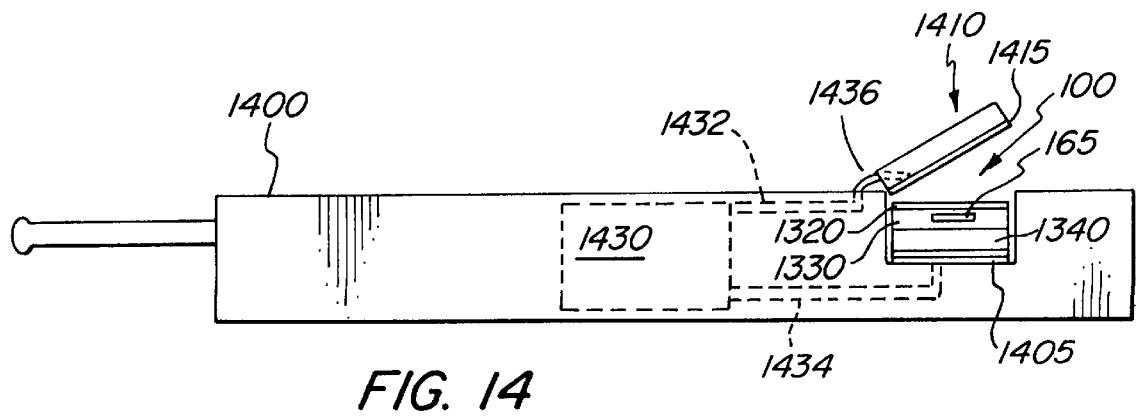
FIG. 14 illustrates a profile view of a cellular telephone using the chip-battery micro-module of FIGS. 1a and 1b in accordance with the present invention.

FIG. 14 illustrates a profile view of a cellular telephone using the chip-battery micro-module of FIGS. 1a and 1b in accordance with the present invention. The telephone 1400 includes circuitry 1430 that is powered via conductive leads 1432 and 1434. Conductive lead 1432 extends to a flexible connection 1436, a lid 1410, and a lid contact 1415. When the chip-battery micro-module 100 is inserted into the telephone 1400 and the lid 1410 is closed, the lid contact 1415 touches the chip-battery micro-module contact 1320, and the bottom surface of the battery 1340 touches the telephone's contact 1405.

Furthermore, since the conductive lead 1434 is connected to the telephone's contact 1405, a closed circuit is formed wherein the chip-battery micro-module 100 powers the circuit 1430.

While a telephone is illustrated in FIG. 14, the chip-battery micro-module of the present invention may be used to power various types of electronic devices, such as low cost active displays, portable calculators, clocks, hand held "personal organizer" computers and the like, watches, or toys, for example.

FIG. 15 illustrates a top foil layout for the chip-battery micro-module of FIGS. 1a and 1b in accordance with the present invention. The chip-battery micro-module 1500 includes a top foil pattern corresponding to a contact that is situated on the chip-battery micro-module 1500. For example, the contact of FIG. 2 may be used with the chip-battery micro-module 1500.

The top foil pattern includes eight segments 1540–1547 that correspond to, and can electrically contact, the contact points of the contact structure 200 of FIG. 2. Thus, when the contact structure 200 is positioned on the foil pattern, the appropriate electrical connections are made between the chip 165 and the contact structure 200. Consequently, the contact structure 200 can electrically couple the chip 165 to a circuit that is external to the chip-battery micro-module 1500, such as that found in a smart card.

For example, the foil segment 1540 includes a contact location 1550 that is electrically coupled to the chip 165 via a bond wire 1575. Similarly, the foil segment 1545 includes a contact location 1552 that is electrically coupled to the chip 165 via a bond wire 1580. The bond wires 1575, 1580 may correspond to the bond wires 175, 180, respectively of FIG. 1a, that provide anode and cathode contacts. Other bond wires may be used to electrically couple the remaining foil segments 1541–1544, 1546 and 1547 to the chip 165. The signals carried in the remaining foil segments may be used for other chip functions known to those skilled in the art, such as power on, ground, transmit, reset, program, clocking signals, and the like.

The foil segments can be photo etched, electroplated, or screened onto the dielectric layer 1535, for instance.

Generally, the foil segment pattern on top of the chip-battery micro-module should correspond to the ISO contact structure. For example, for the orientation-less ISO contact of FIG. 3, the foil segment pattern can be formed as a series of concentric circles. Some of the circles can be used as anode and cathode contacts, while others are used for control signals for the chip. The necessary electrical routing for coupling each circle of the foil segment to the anode, cathode, or chip is believed to be within the purview of those skilled in the art.

The dielectric layer 1535, flap 1550, conductive body 1555, and via 1585, correspond respectively to the dielectric layer 135, flap 150, conductive body 155, and via 185 of FIG. 1a.

A foil bar 1560 may extend over the chip 165 to provide a surface for securing the chip. Specifically, the chip 165 may be adhered to the top or bottom of the bar 1560 using a die attach material. A lower-profile structure results if the chip 165 is adhered to the bottom of the bar 1560. Alternatively, the bar 1560 may not be needed if the foil segments 1540–1547 provide a sufficient contact area for adhering the chip 165.

Accordingly, it can be seen that the present invention provides a chip-battery micro-module and fabrication method thereof wherein an integrated circuit "chip" is secured to a battery coin cell using various conductive and insulative layers that provide power to the chip while also forming a protective structure for carrying and protecting the chip. The chip-battery micro-module may be used to power an electronic accessory which is directly attached thereto, such as an LCD display or speaker, or to power a circuit in a smart card or electronic device such as a portable telephone.

Moreover, the chip may be secured to the battery using epoxy layers, epoxy bodies, dielectric layers, and plasma- or vapor-deposited layers. Furthermore, the above elements may be conductive or insulative as required.

The chip-battery micro-module can be easily integrated into a smart card. For example, conductive ink, plasma deposition of metals, or conductive adhesives may be used to connect the microprocessor module (chip) to the battery in order to facilitate card body production. Production of the card body does not require depositing of foil on the card, or trenching the card to accommodate wires or traces. Accordingly, the cost of producing such cards can be significantly reduced.

Additionally, due to the use of a rigid battery coin cell package, the chip-battery micro-module has excellent strength characteristics for withstanding loads and impact during assembly and handling. Moreover, this protection can be extended to other components, such as electronic accessories, that are packaged with the chip as an assembly. Furthermore, electromagnetic shielding and heat sink properties may be realized.

Additionally, an IC that is relatively large by smart card standards can be packaged with the chip-battery micro-module of the present invention. It has been the practice in the industry to try to maintain the overall die size to approximately 25 mm$^2$ or less to avoid damage to the die due to bending and other handling that smart cards typically undergo. With the excellent rigidity provided by the coin cell body of the present invention, however, dies that are twice as large, or larger, can be used.

Although the invention has been described in connection with various specific embodiments, those skilled in the art will appreciate that numerous adaptations and modifications may be made thereto without departing from the spirit and scope of the invention as set forth in the claims.

For example, in addition to a coin cell, virtually any metallized battery may be used. The battery need not be cylindrical, but may have other shapes, e.g., square or rectangular. Generally, some planar surface area is desired to support the chip. Preferably, the surface is somewhat rigid to provide structural support for the chip and surrounding structure, although a flexible battery package can be secured to a rigid substrate to provide the required rigidity. Moreover, the battery may be larger than the structure used for securing the chip to the support surface.

Furthermore, the chip may be oriented in various configurations other than horizontal, although a horizontal configuration generally allows a low-profile surrounding structure.

Additionally, it is possible to use appropriate transformer circuitry to allow the chip to regulate the output voltage of the battery. The chip can provide a control signal to the battery, where the control signal is a source current that controls the battery output. Optionally, the chip can be used in regulating a recharge signal to the battery.

What is claimed is:

1. An integrated circuit chip package, comprising:

a coin cell battery having oppositely disposed anode and cathode surfaces;

an integrated circuit chip supported by one of said surfaces;

circuitry tor electrically coupling said anode and cathode surfaces to said integrated chip; and a plurality of contact points provided within the perimeter of said battery for coupling said integrated circuit chip to an external circuit;

wherein the entire integrated circuit chip package, including said battery and chip, is substantially provided within the perimeter of said battery.

2. The package of claim 1, wherein the surfaces are substantially planar.

3. The package of claim 1, further comprising:

a deposited insulation layer on the surface which supports the chip;

a deposited conductive layer altitudinally away from the surface which supports the chip after said deposited insulation layer; and means for electrically coupling said deposited conductive layer to one of said anode and cathode surfaces; wherein:

said chip is secured to said deposited conductive layer altitudinally away from the surface which supports che hip after said deposited conductive layer.

4. The package of claim 3, further comprising:

an epoxy body encapsulating said chip, at least in part.

5. The package of claim 1, further comprising:

a conductive layer on the surface which supports the chip;

wherein said conductive layer is electrically coupled to said chip and to one of said anode and cathode surfaces.

6. The package of claim 5, wherein:

said conductive Layer comprises conductive epoxy.

7. The package of claim 5, wherein:

said chip is encapsulated, at least in part, in a non-conductive body.

8. The package of claim 5, wherein said circuitry comprises:

a first bond wire extending from said chip for electrically coupling said chip to said conductive layer and one of said anode and cathode surfaces.

9. The package of claim 8, wherein said circuitry comprises:

a second bond wire extending from said chip for electrically coupling said chip to the other of said anode and cathode surfaces.

10. The package of claim 5, further comprising:

a dielectric layer disposed altitudinally away from the surface which supports the chip after said conductive layer.

11. The package of claim 10, wherein:

said dielectric layer substantially surrounds said chip.

12. The package of claim 10, further comprising:

a bottom foil layer disposed between said conductive layer and said dielectric layer.

13. The package of claim 10, further comprising:

a top foil portion, including at least first and second electrically separated portions thereof, disposed altitudinally away from the surface which supports the chip after said dielectric layer.

14. The package of claim 13, wherein:

said first and second top foil portions are respective foil layers that extend over at least a portion of an area of the surface which supports the chip.

15. The package of claim 13, wherein:

said chip is secured to said first and second top foil portions altitudinally away from the surface which supports the chip after said first and second top foil portions.

16. The package of claim 13, wherein:

said chip is secured to said first and second top foil portions altitudinally away from the surface which supports the chip before said first and second top foil portions.

17. The package of claim 15, further comprising:

an epoxy body encapsulating said chip, at least in part.

18. The package of claim 13, further comprising:

at least one via extending in said dielectric layer for electrically coupling said first top foil portion to one of said anode and cathode surfaces.

19. The package of claim 18, further comprising:

means for electrically coupling said second top foil portion to the other of said anode and cathode surfaces.

20. The package of claim 19, wherein said means for electrically coupling comprises:

a flexible flap extending from said second top foil portion, and past said dielectric Layer toward said other of said anode and cathode surfaces.

21. The package of claim 20, further comprising:

a ring surrounding said battery for securing said flexible flap to said other of said anode and cathode surfaces.

22. The package of claim 13, wherein:

at least one of said first and second top foil portions are adapted to carry an electronic accessory thereon.

23. The package of claim 13, further comprising:

a second conductive layer on the surface which opposes the surface which supports the chip;

said second conductive layer electrically coupled to one of said anode and cathode surfaces;

a second dielectric layer disposed after said second conductive layer and altitudinally away from said surface which is opposing; and a second top foil layer disposed after said second dielectric layer and altitudinally away from said surface which is opposing.

24. The package of claim 23, whereon:

said second top foil layer is adapted to carry art electronic accessory thereon.

25. The package of claim 23, further comprising:

a second bottom foil layer disposed between said second conductive layer and said second dielectric layer.

26. The package of claim 1, wherein:

the contact points are disposed altitudinally away from the surface which supports the chip after said chip; and at least one of the contact points are electrically coupled to at least one of said anode and cathode surfaces.

27. The package of claim 1, wherein:

said contact points are orientation-less.

28. The package of claim 13, wherein:

the contact points are disposed altitudinally away from the surface which supports the chip after said chip;

the contact points are coupled to at least one of said anode and cathode contacts; and said top foil portion is patterned according to said contact points.

29. The package of claim 28, wherein:

the contact points are orientation-less.

30. A smart card for use with the package of claim 1, comprising:

an electrical circuit; and means for electrically coupling said contact points and at least one of said anode and cathode surfaces to said electrical circuit.

31. A smart card for use with the package of claim 1, comprising:

an electrical circuit; and means for electrically coupling said chip to said electrical circuit to allow the communication of control signals therebetween.

32. A method for fabricating an integrated circuit chip package, comprising the steps of:

providing a coin cell battery having oppositely disposed anode and cathode surfaces;

supporting an integrated circuit c-hip on one of said surfaces;

electrically coupling said anode and cathode surfaces to said chip; and providing a plurality of contact points within the perimeter of said battery for coupling said integrated circuit chip to an external circuit;

wherein the entire integrated circuit chip package, including said battery and chip, is substantially provided within the perimeter of said battery.

33. The method of claim 32, comprising the further steps of:

depositing an insulation layer on the surface which supports the chip;

depositing a conductive layer altitudinally away from the surface which supports the chip after said deposited insulation layer; and electrically coupling said deposited conductive layer to one of said anode and cathode surfaces; wherein:

said chip is secured to said deposited conductive layer altitudinally away from the surface which supports the chip after said deposited conductive layer.

34. The method of claim 33, comprising the further step of:

encapsulating said chip, at least in part, with an epoxy body.

35. The method of claim 32, comprising the further steps of:

providing a conductive layer on the surface which supports the chip; and electrically coupling said conductive layer to said chip and to one of said anode and cathode surfaces.

36. The method of claim 35, wherein said electrically coupling step comprises the step of:

providing a first bond wire extending from said chip for electrically coupling said chip to said conductive layer and one of said anode and cathode surfaces.

37. The method of claim 36, wherein said electrically coupling step comprises the step of:

provides a second bond wire extending from said chip for electrically coupling said chip to the other of said anode and cathode surfaces.

38. The method of claim 35, comprising the further step of:

providing a dielectric layer disposed altitudinally away from the surface which supports the chip after said conductive layer.

39. The method of claim 38, comprising the further step of:

providing a bottom foil layer disposed between said conductive Layer and said dielectric layer.

40. The method of claim 38, comprising the further step of:

providing a top foil portion, including at least first and second electrically separated portions thereof, disposed altitudinally away from the surface which supports the chip after said di electric layer.

41. The method of claim 40, comprising the further step of:

securing said chip to said first and second top foil portions altitudinally away from the surface which supports the chip after said first and second top foil portions.

42. The method of claim 40, comprising the further step of:

securing said chip to said first and second top foil portions altitudinally away from the surface which supports the chip before said first and second top foil portions.

43. The method of claim 41, comprising the further step of:

encapsulating said chip, at least An part, with an epoxy body.

44. The method of claim 40, wherein said electrically coupling step comprises the step of:

providing at least one via in said dielectric layer for electrically coupling said first top foil portion to one of said anode and cathode surfaces.

45. The method of claim 40, comprising the further steps of:

providing a second conductive layer on a surface of said battery opposing the surface which supports the chip;

electrically coupling said second conductive layer to one of said anode and cathode surfaces;

providing a second dielectric layer disposed after said second conductive layer and altitudinally away from said surface which is opposing; and providing a second top foil layer disposed after said second dielectric layer and altitudinally away from said surface which is opposing.

46. The method of claim 35, wherein:

the contact points are disposed altitudinally away from the surface which supports the chip after said chip; and at least one of the contact points are electrically coupled to at least one of said anode and cathode surfaces.

47. The method of claim 32, wherein:

the contact points are orientation-less.

48. The method of claim 40, wherein:

the contact points are disposed altitudinally away from the surface which supports the chip after said chip;

the contact points are electrically coupled to at least one of said anode and cathode surfaces; and the top foil portion is patterned according to said contact points.

49. The method of claim 48, wherein:

said contact points are orientation-less.

50. The method of claim 46, comprising the further steps of:

securing said package in a smart card; and electrically coupling said contact points and at least one of said anode and cathode surfaces to an electrical circuit in said smart card.

51. The method of claim 32, comprising the further steps of:

securing said package in a smart card; and electrically coupling said chip to an electrical circuit in said smart card to allow the communication of control signals therebetween.

52. The method of claim 32, comprising the further steps of:

securing said package in a smart card; and electrically coupling said contact points and at least one of said anode and cathode surfaces to an electrical circuit of said smart card.

* * * * *